United States Patent [19]

Kominami et al.

[11] Patent Number: 4,525,636
[45] Date of Patent: Jun. 25, 1985

[54] VARIABLE ELECTRONIC IMPEDANCE CIRCUIT

[75] Inventors: Yasuo Kominami; Yuichi Ohkubo, both of Takasaki; Kohki Aizawa, Sagamihara; Satoshi Sasaki, Tokorozawa, all of Japan

[73] Assignees: Hitachi, Ltd.; Pioneer Electronic Corp., both of Tokyo, Japan

[21] Appl. No.: 413,147

[22] Filed: Aug. 30, 1982

[30] Foreign Application Priority Data

Aug. 28, 1981 [JP]  Japan ................................. 56-134007

[51] Int. Cl.³ ...................... H03K 3/023; H03K 17/16
[52] U.S. Cl. ................................ 307/264; 307/296 R; 307/493; 307/494; 307/362
[58] Field of Search .............. 307/200 A, 296 R, 491, 307/493, 494, 520, 542, 555, 543, 362, 264

[56] References Cited

U.S. PATENT DOCUMENTS 4,066,914  1/1978  Gundry ........................... 307/296 R
4,288,707  9/1981  Katakura ........................... 307/264

Primary Examiner—John Zazworsky
Attorney, Agent, or Firm—Antonelli, Terry & Wands

[57] ABSTRACT

A variable electronic impedance circuit contains a voltage-current converter having an input terminal which is supplied with an input signal voltage, and a variable-gain current amplifier having an input terminal which is supplied with an output current of the voltage-current converter. The output signal current of the amplifier is fed back to the input terminal of the voltage-current converter.

In order to prevent undesirable oscillation immediately after the closure of a power supply switch, the variable electronic impedance circuit includes a control circuit which substantially inhibits the operation of the voltage-current converter for a predetermined time after the closure of the power supply switch.

13 Claims, 2 Drawing Figures

VARIABLE ELECTRONIC IMPEDANCE CIRCUIT

FIELD OF THE INVENTION

The present invention relates to a variable impedance circuit which is utilized in a noise reduction device for use in the recording/playback of audio signals on a magnetic tape, etc.

BACKGROUND OF THE INVENTION

In conventional variable electronic impedance circuits of the type described, for example, in Japanese Laid-open Patent Specification No. 116,052/1977, there often occurs the problem of abnormal radio frequency (RF) oscillation, particularly immediately after the closure or turn-on of a power supply switch, resulting in distortion in the output of the associated receiver circuit.

The cause of the above problem has been determined to be the fact that since such a variable electronic impedance circuit has a feedback path, positive feedback always takes place in the feedback path upon the closure of the power supply switch, resulting in the above-related abnormal oscillation of the radio frequency signal.

SUMMARY OF THE INVENTION

The present invention has been developed on the basis of the results of a study of the above problem, and is intended to provide a variable electronic impedance circuit which is free from an unstable operation immediately after the application of a supply voltage to the associated circuit.

DETAILED DESCRIPTION

Figure 1:
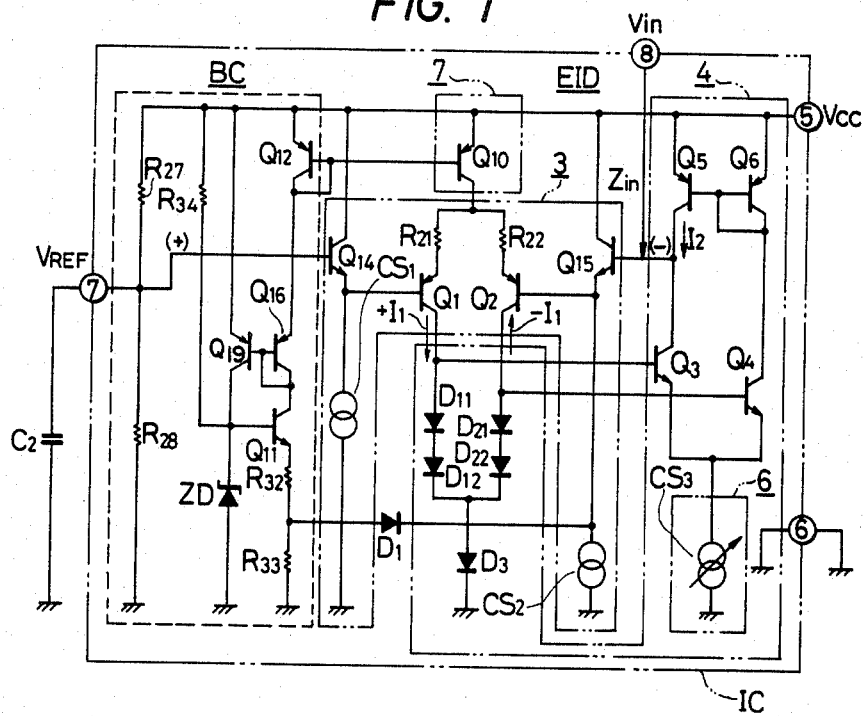
FIG. 1 is a circuit diagram showing a variable electronic impedance circuit acoding to an embodiment of the present invention.

Referring to FIG. 1 which shows a circuit diagram of a variable electronic impedance circuit according to one embodiment of the present invention, the circuit elements encompassed by broken lines IC are formed within a monolithic semiconductor integrated circuit. Numerals enclosed with circles indicate the external terminals of the integrated circuit.

A variable electronic impedance device EID is constructed of a voltage-current converter 3 having a high input impedance, a variable-gain current amplifier 4, a controllable constant current source 6, a constant current source 7 and a bias circuit BC.

The voltage-current converter 3 is constructed of P-N-P transistors $Q_1$ and $Q_2$, resistors $R_{21}$ and $R_{22}$, input N-P-N transistors $Q_{14}$ and $Q_{15}$, and constant current sources $CS_1$ and $CS_2$. The base of the transistor $Q_{14}$ is grounded (in the AC sense) by a capacitance $C_2$ for removing power supply ripple and is supplied with a reference voltage $V_{REF}$ from the bias circuit BC, so that it operates as a reference input terminal of the voltage-current converter 3. Since the base of transistor $Q_{15}$ is fed with an A.C. input signal $V_{in}$, it operates as the signal input terminal of the voltage-current converter 3. Converted output currents $+I_1$ and $-I_1$ are derived from the collectors of the respective transistors $Q_1$ and $Q_2$. Herein, the voltage-current conversion coefficient can be set by the resistances of the resistors $R_{21}$ and $R_{22}$ and the constant current value of the constant current source 7.

The variable-gain current amplifier 4 is constructed of diodes $D_{11}$, $D_{12}$, $D_{21}$, $D_{22}$ and $D_3$, N-P-N transistors $Q_3$ and $Q_4$, and P-N-P transistors $Q_5$ and $Q_6$ which are connected as a current mirror circuit. The converted output currents $+I_1$ and $-I_1$ of the voltage-current converter 3 are converted by the diodes $D_{11}$, $D_{12}$ and $D_{21}$, $D_{22}$ of the variable-gain current amplifier 4 into voltages which are applied to the bases of the transistors $Q_3$ and $Q_4$, respectively. A change in the collector current of the transistor $Q_3$ is directly coupled to the base of the transistor $Q_{15}$, while a change in the collector current of the transistor $Q_4$ is coupled to the base of the transistor $Q_{15}$ through the transistors $Q_6$ and $Q_5$ of the current mirror circuit. Therefore, an amplified current $I_2$ is fed back to the base of the transistor $Q_{15}$ serving as the signal input terminal of the voltage-current converter 3. The current gain $\beta$ of the amplifier can be set by the constant current value of the variable constant current source 6.

Where a stable supply voltage $V_{CC}$ is steadily supplied, the reference voltage $V_{REF}$ determined by the resistance ratio between voltage dividing resistors $R_{27}$ and $R_{28}$ is continually applied to the base of the transistor $Q_{14}$, and hence, the base of the transistor $Q_{15}$ is maintained at a potential substantially equal to the reference voltage $V_{REF}$ by the feedback operation of the variable electronic impedance device. Accordingly, when the voltage dividing resistances $R_{27}$ and $R_{28}$ are equal to each other, the reference voltage $V_{REF}$ becomes $V_{CC}/2$.

As noted above, letting $\alpha$ denote the conversion coefficient of the voltage-current converter 3, and $\beta$ the current gain of the variable-gain amplifier 4, an A.C. input impedance $Z_{in}$, in the case where the A.C. signal $V_{in}$ has been applied to the signal input terminal of the voltage-current converter 3, can be evaluated as follows by referring to the block diagram of FIG. 2:

$$I_1 = \alpha \cdot V_{in} \qquad (1)$$
$$I_2 = \beta \cdot I_1 = \alpha \cdot \beta \cdot V_{in} \qquad (2)$$
$$\therefore Z_{in} = \frac{V_{in}}{I_2} = \frac{1}{\alpha \cdot \beta} \qquad (3)$$

Next, immediately after the supply voltage $V_{CC}$ has been applied to terminal No. 5 via a power supply switch (not shown), the reference voltage at terminal No. 7 does not rise to $V_{CC}/2$ due to a time constant which is determined by the product of voltage dividing resistor $R_{27}$ and the capacitor $C_2$. Accordingly the transistor $Q_{14}$ is turned "off", and a comparatively large current flows to the base of the transistor $Q_1$ from constant current course $CS_1$ which becomes operative quickly after the closure of the power supply switch, so that the transistor $Q_1$ is turned "on".

On the other hand, the base of a transistor $Q_{11}$ in the bias circuit BC is supplied with the supply voltage $V_{CC}$ through a starting resistor $R_{34}$. Therefore, immediately after the supply voltage $V_{CC}$ has been applied, transistor $Q_{11}$ is turned "on". Accordingly, the Zener voltage of a Zener diode ZD is divided by resistors $R_{32}$ and $R_{33}$, and the divided voltage is fed to the anode of a diode $D_1$ which is particularly employed in accordance with the present invention. Diode $D_1$ becomes conductive, the base potential of the transistor $Q_2$ and the emitter potential of the transistor $Q_{15}$ of the voltage-current converter 3 are controlled at a high level, and each of transistors $Q_2$ and $Q_{15}$ are turned "off".

In this manner, due to the provision of diode $D_1$, transistors $Q_1$ and $Q_2$ of the voltage-current converter 3 become unbalanced immediately after the application of the supply voltage $V_{CC}$. Transistor $Q_1$ is turned "on" and the other transistor $Q_2$ is turned "off", so that converted output currents responsive to the A.C. input signal $V_{in}$ cannot be derived from the collectors of the transistors $Q_1$ and $Q_2$. That is, diode $D_1$ operates as a control circuit which substantially inhibits the operation of the voltage-current converter 3 for a predetermined period of time after the closure of the power supply switch. As a consequence, an amplified current responsive to the A.C. input signal is not fed from the variable-gain current amplifier 4 back to the signal input terminal of the voltage-current converter 3, so that the feedback operation of the variable electronic impedance device is prevented during this predetermined period of time.

Figure 2:
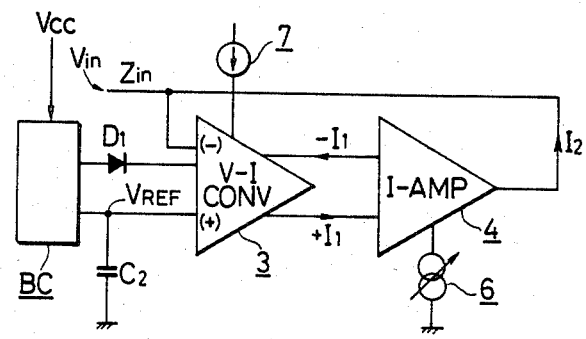
FIG. 2 is a block diagram for explaining the operation of the circuit in FIG. 1.

Thus, according to the present invention, as illustrated in the block diagram of FIG. 2, immediately after the application of the supply voltage $V_{CC}$, the bias circuit BC supplied a voltage of a comparatively high level to the control input terminal of the voltage-current converter 3 through the diode $D_1$ and feeds a reference voltage $V_{REF}$ of a low level to the reference input terminal (+). Consequently, the voltage-current converter 3 is substantially incapable of responding to the A.C. input signal $V_{in}$ applied to its signal input terminal (−), and the feedback operation of the variable electronic impedance device is substantially prevented. Therefore, abnormal oscillation of a radio frequency signal immediately after the closure of the power supply switch can be prevented.

After the initial predetermined time following closure of the power supply switch has passed, the capacitor $C_2$ becomes charged to a point that the base voltage of the transistor $Q_{14}$ becomes sufficiently high-level so that the transistor $Q_{14}$ becomes "conductive". As a result, the base voltage of the transistor $Q_1$ finally reaches to a level of $V_{REF} - V_{BEQ14} = \frac{1}{2}V_{CC} - V_{BEQ14}$ (where $V_{BEQ14}$ denotes the base-emitter voltage of the transistor $Q_{14}$).

By setting this level ($\frac{1}{2}V_{CC} - V_{BEQ14}$) to be higher than the voltage which is applied from the common junction of the dividing resistors $R_{32}$ and $R_{33}$ to the base of the transistor $Q_2$ through the diode $D_1$, the transistor $Q_2$ becomes "conductive", after a predetermined period of time subsequent to the application of power supply. Thus, the large collector current of the transistor $Q_2$ is converted to a large voltage by the diodes $D_{21}$, $D_{22}$ and $D_3$. By the application of this large voltage to the base of the transistor $Q_4$, the conductivity of the transistor $Q_4$ is increased, while the conductivity of the transistor $Q_3$ is decreased. Thus, the conductivities of the transistors $Q_5$ and $Q_6$ are also increased. Therefore, the current which is supplied from the collector of the transistor $Q_5$ to the base of the transistor $Q_{15}$ increases, so that the transistor $Q_{15}$ becomes "conductive"

Since both of the transistors $Q_{14}$ and $Q_{15}$ are "conductive", the base voltage of the transistor $Q_{15}$ becomes equal to the base voltage ($\frac{1}{2}V_{CC}$) of the transistor $Q_{14}$ due to the D.C. feedback operation from the output of the variable-gain current amplifier 4 to the signal input terminal (−) of the voltage-current converter 3. Thus, the emitter voltage of the transistor $Q_{15}$ (i.e. the cathode voltage of the diode $D_1$) reaches a level of $\frac{1}{2}V_{CC} - V_{BEQ15}$ ($V_{BEQ15}$ denotes the base-emitter voltage of the transistor $Q_{15}$). Since the voltage at the common junction of the dividing resistors $R_{32}$ and $R_{33}$ is lower than the level of $\frac{1}{2}V_{CC} - V_{BEQ15}$, the diode $D_1$ becomes reversely biased and "non-conductive". Thus, this diode $D_1$ does not affect the steady state operation of the variable electronic impedance circuit after the predetermined period of time subsequent to the application of power supply.

While we have shown and described an embodiment in accodance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A variable electronic impedance circuit comprising:
   a power supply terminal to which a power supply voltage is to be coupled for supplying an operational voltage to said circuit;
   a voltage-current converter having a first input terminal coupled to receive an input signal voltage;
   a variable-gain current amplifier having an input terminal coupled to receive an output current produced by said voltage-current converter and generating an output signal current which is coupled to said first input terminal of said voltage-current converter; and
   means, coupled to said power supply terminal and said voltage-current converter, for preventing the operation of said voltage-current converter for a predetermined period of time subsequent to the application of said power supply voltage to said power supply terminal.

2. A variable electronic impedance circuit according to claim 1, wherein said means comprises means for applying a first prescribed bias voltage to said first input terminal of said voltage-current converter upon the application of said power supply voltage to said power supply terminal.

3. A variable electronic impedance circuit according to claim 2, wherein said voltage-current converter has a second input terminal coupled to receive a bias voltage applied thereto, and wherein said operation preventing means further comprises means for applying a second prescribed bias voltage, the magnitude of which changes gradually, to said second input terminal in response to the application of said power supply voltage to said power supply terminal.

4. A variable electronic impedance circuit according to claim 3, wherein said means for applying said first prescribed bias voltage includes a Zener diode circuit which establishes said first bias voltage in accordance with the Zener voltage of a Zener diode in said Zener diode circuit, and said means for applying said second predetermined bias voltage to said second input terminal comprises a resistance-capacitance network, the time constant of which controls the gradual change in the magnitude of said second bias voltage, and the capacitance of which is coupled to remove ripple components in said power supply voltage.

5. A variable electronic impedance circuit comprising:

a power supply terminal to which a power supply voltage is to be coupled for supplying an operational voltage to said circuit, a voltage-current converter having a first inpu terminal coupled to receive an input signal voltage;

a variable-gain current amplifier having an input terminal coupled to receive an output current produced by said voltage-current converter and generating an output signal current which is coupled in a feedback path to said first input terminal of said voltage-current converter; and means, coupled to said power supply terminal and said voltage-current converter, for preventing an abnormal generation of a radio-frequency signal in said circuit in response to the application of said power supply voltage to said power supply terminal.

6. A variable electronic impedance circuit according to claim 5, wherein said means comprises means for preventing the generation of a positive feedback signal from said variable-gain current amplifier to said voltage-current converter in response to the application of said power supply voltage to said power supply terminal.

7. A variable electronic impedance circuit according to claim 5, wherein said means comprises means for delaying the operation of said voltage-current converter for a predetermined period of time subsequent to the application of said power supply voltage to said power supply terminal.

8. A variable electronic impedance circuit according to claim 7, wherein said means comprises means for applying a first prescribed bias voltage to said first input terminal of said voltage-current converter upon the application of said power supply voltage to said power supply terminal.

9. A variable electronic impedance circuit according to claim 5, wherein said voltage-current converter is comprised of a pair of symmetrical, differentially-connected circuits and said means comprises means for causing an imbalance in the operation of said differentially-connected circuits in response to the application of said power supply voltage to said power supply terminal.

10. A variable electronic impedance circuit according to claim 9, wherein said imbalance causing means comprises means for applying a first prescribed bias voltage to one of said circuits upon the application of said power supply voltage to said power supply terminal.

11. A variable electronic impedance circuit according to claim 9, wherein said first input terminal of said voltage-current converter is coupled to one of said circuits and said voltage-current converter has a second input terminal coupled to the other of said circuits and wherein said imbalance causing means comprises means for applying a first prescribed bias voltage to said first input terminal upon the application of said power supply voltage to said power supply terminal.

12. A variable electronic impedance circuit according to claim 11, wherein said preventing means includes means for applying a second prescribed bias voltage, the magnitude of which changes gradually, to said second input terminal in response to the application of said power supply voltage to said power supply terminal.

13. A variable electronic impedance circuit according to claim 12, wherein said means for applying said first prescribed bias voltage includes a Zener diode circuit which establishes said first bias voltage in accordance with the Zener voltage of a Zener diode in said Zener diode circuit, and said means for applying said second predetermined bias voltage to said second input terminal comprises a resistance-capacitance network, the time constant of which controls the gradual change in the magnitude of said second bias voltage, and the capacitance of which is coupled to remove ripple components in said power supply voltage.

* * * * *